US008488828B2

(12) United States Patent
Akino

(10) Patent No.: US 8,488,828 B2
(45) Date of Patent: Jul. 16, 2013

(54) UNIDIRECTIONAL CONDENSER MICROPHONE UNIT

(75) Inventor: Hiroshi Akino, Machida (JP)

(73) Assignee: Kabushiki Kaisha Audio-Technica, Machida-Shi (JP)

(*) Notice: Subject to any disclaimer, the term of this patent is extended or adjusted under 35 U.S.C. 154(b) by 134 days.

(21) Appl. No.: 13/064,709

(22) Filed: Apr. 11, 2011

(65) Prior Publication Data

US 2011/0293127 A1 Dec. 1, 2011

(30) Foreign Application Priority Data

May 31, 2010 (JP) ................................ 2010-123761

(51) Int. Cl.
*H04R 21/02* (2006.01)
*H04R 25/00* (2006.01)
*H03G 5/00* (2006.01)

(52) U.S. Cl.
USPC ............ 381/356; 381/355; 381/101; 381/191

(58) Field of Classification Search
USPC ................. 381/356, 396, 355, 369, 113, 189, 381/398, 345, 387, 395; 439/101, 218
See application file for complete search history.

(56) References Cited

U.S. PATENT DOCUMENTS

| | | | | |
|---|---|---|---|---|
| 5,097,515 | A * | 3/1992 | Baba | 381/191 |
| 8,218,806 | B2 * | 7/2012 | Akino et al. | 381/355 |
| 2005/0148227 | A1 * | 7/2005 | Akino | 439/218 |
| 2006/0046538 | A1 * | 3/2006 | Akino | 439/101 |
| 2008/0159576 | A1 * | 7/2008 | Akino et al. | 381/355 |

* cited by examiner

*Primary Examiner* — James A Thompson
*Assistant Examiner* — Nicole Gillespie
(74) *Attorney, Agent, or Firm* — Manabu Kanesaka

(57) ABSTRACT

A unidirectional condenser microphone unit includes a unit casing formed of a metallic cylindrical body and having a front acoustic terminal on a front surface thereof and a rear acoustic terminal on a side surface thereof, an electrostatic acousto-electric converter disposed inside the unit casing, and a shield member put on the rear acoustic terminal from an inside of the unit casing in a cylindrical shape. The shield member has a length approximately equal to an inner periphery length of the unit casing and a width covering the rear acoustic terminal. Also, the shield member is formed of a metal plate having spring elasticity, and includes a large number of holes for electromagnetic shield substantially throughout the entire surface thereof.

6 Claims, 2 Drawing Sheets

UNIDIRECTIONAL CONDENSER MICROPHONE UNIT

CROSS-REFERENCE TO RELATED APPLICATION

The present application is based on, and claims priority from, Japanese Application Serial Number JP2010-123761, filed May 31, 2010, the disclosure of which is hereby incorporated by reference herein in its entirety.

TECHNICAL FIELD

The present invention relates to a unidirectional condenser microphone unit and, more particularly, to a shield of a rear acoustic terminal provided on a unit casing.

BACKGROUND ART

As shown in the schematic view of FIG. 6, a unidirectional condenser microphone unit (hereinafter, sometimes referred simply to as a "microphone unit") includes, as a basic configuration, a cylindrical unit casing 10 and an electrostatic acousto-electric converter 20 housed in the unit casing 10.

The unit casing 10 is formed of a metallic material such as a brass alloy, and is provided with a front acoustic terminal 11 on the front surface (the surface on the side directed to a sound source) thereof and a rear acoustic terminal 12 for taking in a velocity component on the side surface side thereof.

The acousto-electric converter 20 includes a diaphragm assembly 21 stretchingly provided with a diaphragm on a diaphragm ring, a spacer ring 22 formed of an electrical insulating material, and an insulating seat assembly 23 formed by fixing a backplate to an insulating seat.

These constituent elements (the diaphragm assembly 21, the spacer ring 22, and the insulating seat assembly 23) are assembled so as to be laminated in sequence with the inner surface of the unit casing 10 being used as a guide, and thereafter are fixed together in the state in which a proper stress is applied by a lock ring 13 engaging threadedly with internal threads in the unit casing 10.

On the rear acoustic terminal 12, a metallic netty member 14 is put from the inside of the unit casing 10 as a shield member for inhibiting extraneous electromagnetic waves (for example, electromagnetic waves emitted from a cellular phone) causing the production of noise from intruding into the unit casing 10.

The metallic netty member 14 is formed by weaving metal wires. Therefore, the wires are connected electrically to each other at contact points of intersections, so that when the metallic netty member 14 is rounded into a cylindrical shape, the contact becomes unstable. If the netty member 14 of this state is inserted into the unit casing 10 and is put on the rear acoustic terminal 12, the netty member 14 comes into contact with the unit casing 10 at unspecified contact points, so that the shield becomes unstable.

Accordingly, in the invention described in Japanese Patent Application Publication No. 2008-166909, as shown in FIG. 6, in the unit casing 10, a coil spring 15, which is preferably gold-plated and is used to push the metallic netty member 14 against the inner surface of the unit casing 10, is provided. Thereby, the metallic netty member 14 is brought into contact with the unit casing 10 at many points, and therefore the electromagnetic shield is made more reliable.

In the above-described conventional art, however, the coil spring 15 is needed, and accordingly the cost increases. Also, in the case where the pushing force of the coil spring 15 against the metallic netty member 14 is insufficient, the contact is still unstable in some cases.

Also, the acousto-electric converter 20 is fixed into the unit casing 10 by applying a stress by using the lock ring 13. However, if the tightening stress is too high, the acousto-electric converter 20 may be destroyed. Inversely, if the stress is too low, noise may be produced by the looseness between parts when the microphone unit is vibrated.

To solve this problem, the tightening torque of the lock ring 13 is controlled by using a tool such as a torque wrench. However, this work requires much time and labor, and therefore is unfavorable in terms of productivity. Also, the lock ring 13 is usually expensive because of being produced by cutting.

For an inexpensive article using no lock ring, the unit casing 10 is made of, for example, aluminum, and the acousto-electric converter 20 is fixed by staking the opening portion on the rear end side of the unit casing 10. However, in this case as well, it is difficult to apply a proper staking force (a stress corresponding to the incorporated part). Further, the productivity is poor because the microphone units are staked one by one by using a staking machine.

Also, for the acousto-electric converter 20, because the constituent elements of the diaphragm assembly 21, the spacer ring 22, and the insulating seat assembly 23 are assembled with the inner surface of the unit casing 10 being used as a guide, a certain degree of clearance is needed between each of the constituent elements and the unit casing 10. However, if the clearance is too large, there occurs eccentricity (off-centering) among these constituent elements, whereby the performance is varied or deteriorated by the change in effective vibration area and the like.

Accordingly, an object of the present invention is to provide a unidirectional condenser microphone unit in which reliable electromagnetic shieldability is provided for a rear acoustic terminal of a unit casing, an acousto-electric converter can be fixed in the unit casing by applying a proper stress, and the eccentricity among the constituent elements of the acousto-electric converter in the unit casing is made as small as possible.

SUMMARY OF THE INVENTION

To achieve the above object, the present invention provides a unidirectional condenser microphone unit comprising a metallic cylindrical body, in which an electrostatic acousto-electric converter is incorporated in a unit casing having a front acoustic terminal on a front surface thereof and a rear acoustic terminal on a side surface thereof, and a shield member is put on the rear acoustic terminal from the inside of the unit casing, wherein the shield member has a length approximately equal to the inner periphery length of the unit casing and a width covering the rear acoustic terminal, is formed with a large number of holes for electromagnetic shield almost throughout the entire surface thereof, and comprises a metallic porous plate having spring elasticity, which is put on the rear acoustic terminal from the inside of the unit casing in a state of being rounded into a cylindrical shape.

According to this configuration, the metallic porous plate having spring elasticity, which is used as the shield member for the rear acoustic terminal, comprises one metallic plate (preferably, a stainless steel plate formed with a large number of holes by etching), and can provide stable shield because having no contact portions of wires unlike the metallic netty member. Therefore, the porous plate can provide better electrostatic shield than the metallic netty member. Also, the coil spring for pushing is not needed.

As a preferable mode, on a single long edge side of the porous plate, there is integrally formed a locking claw which is bent at a predetermined angle toward the center of the unit casing, and comes elastically into contact with the acousto-electric converter.

As a further preferable mode, the plurality of locking claws are provided on the single long edge side so as to be arranged at equal intervals along the circumferential direction of the inner surface of the unit casing.

According to this configuration, on the single long edge side of the metallic porous plate having spring elasticity, which is used as the shield member for the rear acoustic terminal, there is integrally formed the locking claw that is bent at a predetermined angle toward the center of the unit casing, and comes elastically into contact with the acousto-electric converter. Therefore, as the porous plate is mounted in the portion of the rear acoustic terminal, the acousto-electric converter is fixed by the locking claw, so that a lock ring or staking work for fixing the acousto-electric converter is not needed.

Also, on the single long edge side of the porous plate, there is integrally formed a tongue piece for positioning that intrudes between the inner surface of the unit casing and the acousto-electric converter.

Further, at least two tongue pieces for positioning are provided on the single long edge side so as to be arranged at positions 180° opposed to each other of the inner surface of the unit casing.

According to this configuration, on the single long edge side of the metallic porous plate having spring elasticity, which is used as the shield member for the rear acoustic terminal, there is integrally formed the tongue piece for positioning that intrudes between the inner surface of the unit casing and the acousto-electric converter. Therefore, as the porous plate is mounted in the portion of the rear acoustic terminal, the tongue piece for positioning intrudes between the inner surface of the unit casing and the acousto-electric converter. Thereby, the eccentricity among the constituent elements of the acousto-electric converter can be made smaller.

As a further preferable mode, on the single long edge side of the porous plate, there are integrally formed the locking claw, which is bent at a predetermined angle toward the center of the unit casing, and comes elastically into contact with the acousto-electric converter, and the tongue piece for positioning, which intrudes between the inner surface of the unit casing and the acousto-electric converter.

According to this configuration, on the single long edge side of the metallic porous plate having spring elasticity, which is used as the shield member for the rear acoustic terminal, there are integrally formed the locking claw, which is bent at a predetermined angle toward the center of the unit casing, and comes elastically into contact with the acousto-electric converter, and the tongue piece for positioning, which intrudes between the inner surface of the unit casing and the acousto-electric converter. Therefore, as the porous plate is mounted in the portion of the rear acoustic terminal, the acousto-electric converter is fixed by the locking claw, and also the eccentricity among the constituent elements of the acousto-electric converter can be made smaller by the tongue piece for positioning.

DETAILED DESCRIPTION

An embodiment of the present invention will now be described with reference to FIGS. 1 to 5. The present invention is not limited to this embodiment.

Figure 1:
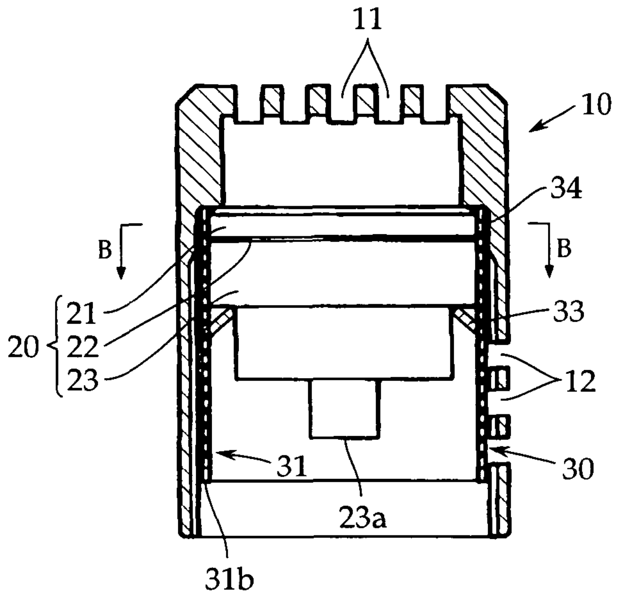
FIG. 1 is a schematic sectional view showing an embodiment of the present invention.
Figure 6:
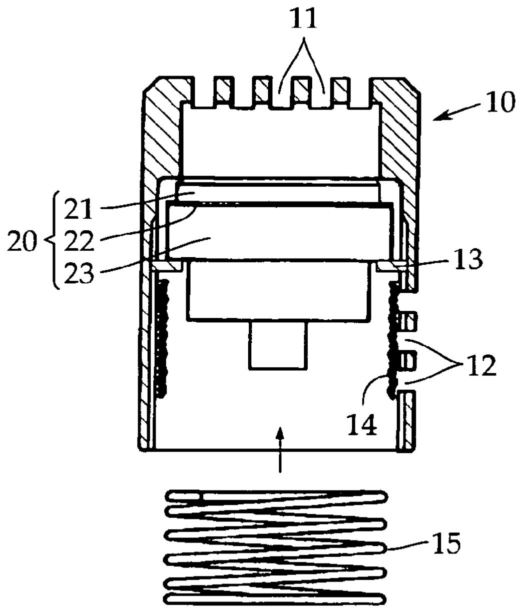
FIG. 6 RELATED ART
FIG. 6 is a schematic sectional view showing a conventional example.

Referring to FIG. 1, like the conventional example explained before with reference to FIG. 6, a microphone unit in accordance with this embodiment includes, as a basic configuration, a unit casing 10 and an electrostatic acousto-electric converter 20 housed in the unit casing 10.

In this embodiment, the unit casing 10 is formed of a metallic material such as a brass alloy, and is provided with a front acoustic terminal 11 on the front surface (the surface on the side directed to a sound source) thereof. On the side surface side of the unit casing 10, there is provided a rear acoustic terminal 12 for taking in a velocity component. The unit casing 10 may be formed of an aluminum material.

The acousto-electric converter 20 includes a diaphragm assembly 21 stretchingly provided with a diaphragm on a diaphragm ring, a spacer ring 22 formed of an electrical insulating material, and an insulating seat assembly 23 formed by fixing a backplate to an insulating seat. These constituent elements are assembled so as to be laminated in sequence with the inner surface of the unit casing 10 being used as a guide.

On the back surface of the insulating seat assembly 23, an extraction electrode **23*a* for the backplate is provided. The extraction electrode 23*a* is electrically connected to an impedance converter, not shown. A circuit board mounted with the impedance converter may also be housed in the unit casing 10 together with the acousto-electric converter 20**.

Figure 2:
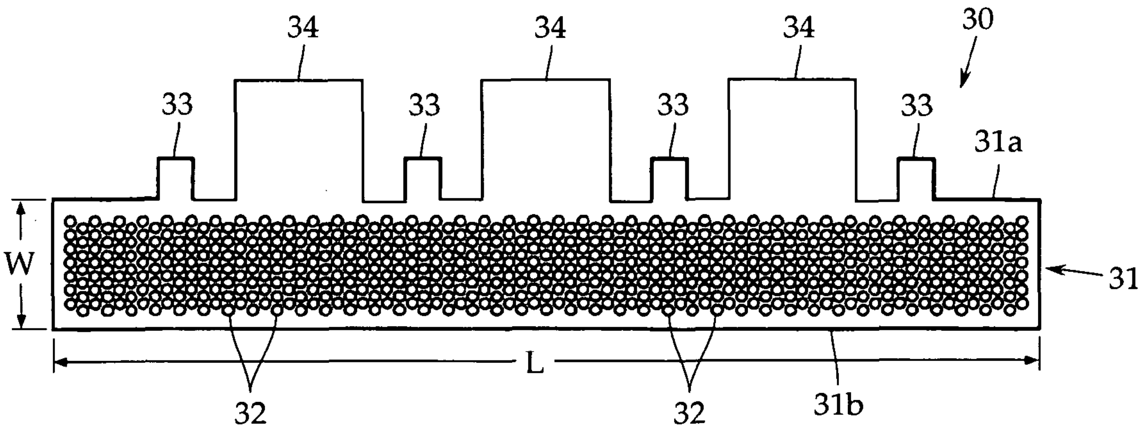
FIG. 2 is a developed view of a shield member in an embodiment of the present invention.

After the acousto-electric converter 20 has been housed in the unit casing 10, a shield member 30 is put on the rear acoustic terminal 12 from the inside of the unit casing 10. The shield member 30 in accordance with this embodiment consists of a porous plate 31 as shown in FIG. 2.

This porous plate 31 is a band-shaped member the length L of which is approximately equal to the inner periphery length of the unit casing 10 and the width W of which is a width covering the rear acoustic terminal 12, and a large number of holes 32 for electromagnetic shield are formed almost throughout the entire surface thereof. The porous plate 31 is formed of a metallic material having spring elasticity (a plate spring material).

Preferably, the porous plate 31 is a 50-μm thick stainless steel plate, and is formed with 0.3-μm diameter holes 32 arranged in a zigzag form at a pitch of 0.4 μm. Such holes 32 can be formed easily by etching.

Figure 3:
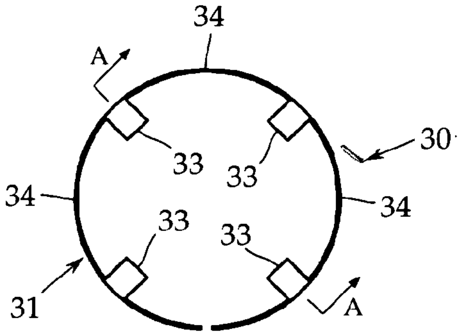
FIG. 3 is a plan view showing a state in which the shield member shown in FIG. 2 is rounded.

The porous plate 31 is disposed in the unit casing 10 in a state of being rounded into a cylindrical shape as shown in FIG. 3. The porous plate 31 can provide stable shield for the rear acoustic terminal 12 because having no contact portions of wires unlike the metallic netty member. Therefore, the porous plate 31 can provide better electrostatic shield than the metallic netty member. Also, because the porous plate 31 itself has spring elasticity, the coil spring for pushing is not needed.

According to this embodiment, on the single long edge (the long edge arranged on the interior side of the unit casing 10) 31*a* side of the porous plate 31, locking claws 33 for fixing the acousto-electric converter 20 and tongue pieces 34 for coaxially positioning the constituent elements (21 to 23) of the acousto-electric converter 20 are connectingly provided integrally.

Figure 4:
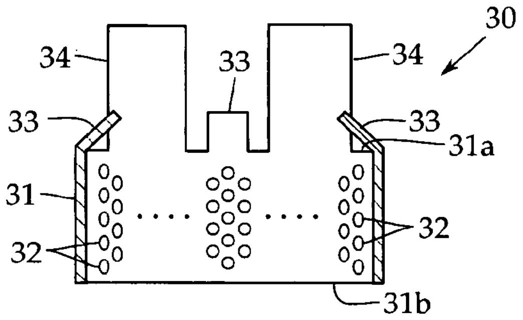
FIG. 4 is a sectional view taken along the line A-A of FIG. 3.

Referring to both of FIGS. 3 and 4, the locking claws 33 are bent beforehand at a predetermined angle toward the center of the unit casing 10. As the porous plate 31 is mounted in the portion of the rear acoustic terminal 12 as shown in FIG. 1, the porous plate 31 is brought elastically into contact with the back surface side of the acousto-electric converter 20, and thereby the acousto-electric converter 20 is fixed in the unit casing 10.

When the porous plate 31 is mounted in the portion of the rear acoustic terminal 12, the other long edge 31*b* side of the porous plate 31 is preferably fixed to the unit casing 10 with an adhesive or the like.

In order to stably fix the acousto-electric converter 20, a plurality of (four in this example) locking claws 33 are preferably provided on the single long edge 31*a* side of the porous plate 31 so as to be arranged at equal intervals along the circumferential direction of the inner surface of the unit casing 10.

Also, the tongue pieces 34 each have a length capable of intruding between the inner surface of the unit casing 10 and the acousto-electric converter 20, and are arranged between the locking claws 33. The width of the tongue piece 34 may be determined arbitrarily.

Figure 5:
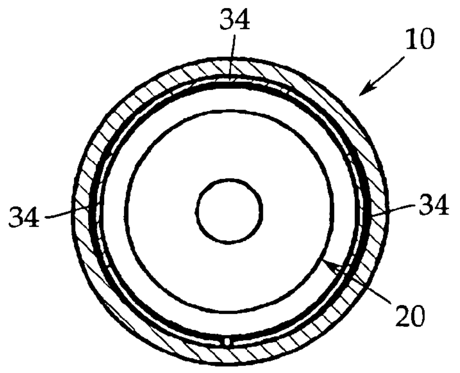
FIG. 5 is a sectional view taken along the line B-B of FIG. 1.

In this example, three tongue pieces 34 are provided. As shown in FIGS. 1 and 5, as the porous plate 31 is mounted in the portion of the rear acoustic terminal 12, the tongue pieces 34 intrude between the inner surface of the unit casing 10 and the acousto-electric converter 20. According to this configuration, the constituent elements (21 to 23) of the acousto-electric converter 20 can be positioned coaxially.

In order to coaxially position the constituent elements (21 to 23) of the acousto-electric converter 20, the tongue pieces 34 should be provided on the single long edge 31*a* side of the porous plate 31 so that at least two tongue pieces 34 are arranged at positions 180° opposed to each other of the inner surface of the unit casing 10.

In the above-described embodiment, both of the locking claws 33 and the tongue pieces 34 are provided on the porous plate 31. However, the present invention additionally embraces a mode in which neither locking claws 33 nor the tongue pieces 34 are provided on the porous plate 31, and a mode in which the locking claws 33 or the tongue pieces 34 are provided on the porous plate 31. Also, the holes 32 may be provided in the portions of the locking claws 33 and the tongue pieces 34.

The invention claimed is:

1. A unidirectional condenser microphone unit, comprising:

- a unit casing formed of a metallic cylindrical body and having a front acoustic terminal on a front surface thereof and a rear acoustic terminal on a side surface thereof,
- an electrostatic acousto-electric converter disposed inside the unit casing, and
- a shield member wound in a cylindrical shape and put on the rear acoustic terminal from an inside of the unit casing,
- wherein the shield member has a length approximately equal to an inner periphery length of the unit casing and a width covering the rear acoustic terminal, and
- the shield member is formed of a metal plate having spring elasticity, and includes a large number of holes penetrating through the metal plate for electromagnetic shield substantially throughout the entire surface thereof.

2. The unidirectional condenser microphone unit according to claim 1, wherein the shield plate includes a locking claw on one long edge side, which is bent at a predetermined angle toward a center of the unit casing, and elastically contacts with the acousto-electric converter so that the electrostatic acousto-electric converter is elastically supported in the unit casing by the locking claw of the shield plate.

3. The unidirectional condenser microphone unit according to claim 2, wherein the plurality of locking claws is arranged at a predetermined interval along a circumferential direction of an inner surface of the unit casing.

4. The unidirectional condenser microphone unit according to claim 3, wherein the shield plate further includes a tongue piece for positioning, placed between the inner surface of the unit casing and the acousto-electric converter.

5. The unidirectional condenser microphone unit according to claim 4, wherein at least two tongue pieces for positioning are provided on the one long edge side so as to be arranged at positions 180° opposed to each other at the inner surface of the unit casing.

6. The unidirectional condenser microphone unit according to claim 5, wherein the plurality of locking claws and the plurality of tongue pieces are arranged one after the other at the shield plate.

* * * * *